United States Patent
Bergemont

(12) 
(10) Patent No.: US 6,238,979 B1
(45) Date of Patent: May 29, 2001

(54) PROCESS FOR FABRICATING EEPROM MEMORY CELL ARRAY EMBEDDED ON CORE CMOS

(75) Inventor: Albert Bergemont, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/599,052

(22) Filed: Jun. 21, 2000

(51) Int. Cl.$^7$ .............................................. H01L 21/8247
(52) U.S. Cl. .......................... 438/264; 257/315; 438/258
(58) Field of Search .................... 438/257–267; 257/315–321

(56) References Cited

U.S. PATENT DOCUMENTS 5,498,560 * 3/1996 Sharma et al. .
6,043,123 * 3/2000 Wang et al. ..................... 438/258
6,071,778 * 6/2000 Bez et al. ......................... 438/257

* cited by examiner

Primary Examiner—Richard Booth
(74) Attorney, Agent, or Firm—Wagner, Murabito & Hao LLP

(57) ABSTRACT

A process of fabricating an electrically erasable programmable read only memory cell embedded on core complementary metal oxide silicon for analog applications. First, a P-well region is formed. A first N-well region is formed within the P-well, and a second N-well region is formed within the P-well spaced apart from the first N-well. A first field oxide layer is deposited over the P-well, the first N-well, and the second N-well. A high-voltage oxide layer is grown over the first field oxide layer. A first photoresist mask which defines a tunneling window is then overlaid. The first field oxide layer and the high-voltage oxide layer are then etched. Afterwards, the first photoresist mask is stripped. A tunnel oxide layer is grown. A polysilicon layer is grown on top of the tunnel oxide layer and then doped. A second photoresist mask which defines a floating gate is overlaid on top of the polysilicon layer. The polysilicon layer is then etched, and the second photoresist mask is stripped away.

18 Claims, 13 Drawing Sheets

|              | BLn  | BLn' | BLn+1 | BLn+1' | $\overline{N_1}$ | $\overline{N_2}$ | $\overline{N_3}$ |
|--------------|------|------|-------|--------|------------------|------------------|------------------|
| WRITE A      | $V_{PP}$ | $V_{PP}$ |       |        | $V_{SS}$ | $V_{PP}$ |          |
| $\overline{\text{WRITE B}}$ |      |      | $V_{SS}$ | $V_{SS}$ | $V_{SS}$ | $V_{PP}$ |          |
| $\overline{\text{WRITE C}}$ | $V_{PP}$ | $V_{PP}$ |       |        |          | $V_{PP}$ | $V_{PP}$ |
| $\overline{\text{WRITE D}}$ |      |      | $V_{SS}$ | $V_{SS}$ |          | $V_{PP}$ | $V_{PP}$ |
| ERASE A, B   | $\overline{V_{SS}}$ | $\overline{V_{SS}}$ | $V_{SS}$ | $V_{SS}$ | $\overline{V_{PP}}$ | $\overline{V_{SS}}$ |          |
| $\overline{\text{ERASE C, D}}$ | $V_{SS}$ | $V_{SS}$ | $V_{SS}$ | $V_{SS}$ |          | $V_{SS}$ | $V_{SS}$ |

FIG. 8

PROCESS FOR FABRICATING EEPROM MEMORY CELL ARRAY EMBEDDED ON CORE CMOS

TECHNICAL FIELD

The present invention relates to the field of electrically erasable programmable read only memory (EEPROM) devices. In particular, the present invention relates to a process for fabricating a EEPROM cell array which is embedded on core CMOS for analog applications.

BACKGROUND ART

Solid state memory is used to store digital bits (i.e., "1's and 0's) of data by means of semiconductor circuits. Solid state memory is classified as being either volatile memory or non-volatile memory. Volatile memory retains the digital bits of data only so long as power is applied and maintained to the circuits. For example, dynamic random access memory (DRAM) is often used in computer systems to temporarily store data as it is being processed by the microprocessor or CPU. Non-volatile memory, on the other hand, retains its digital bits of data, even after power has been shut off from the circuits. One common example of non-volatile memory is read-only memory (ROM). Some read-only memory can be programmed; these types of devices are known as programmable read-only memory (PROM). There exists a category of PROM devices which can be electrically erased so that they can actually be reprogrammed many times over to store different sets of data. These electrically erasable programmable read only memory are commonly referred to as EEPROMs.

EEPROM memory devices are typically comprised of an array of memory cells. Each individual memory cell can be programmed to store a single bit of data. The basic, fundamental challenge then in creating an EEPROM memory cell is to use a controllable and reproducible electrical effect which has enough nonlinearity so that the memory cell can be written or erased at one voltage in less than 1 ms and can be read at another voltage, without any change in the programmed data for more than 10 years.

Fowler-Nordheim tunneling, which was first described by Fowler and Nordheim in 1928, exhibits the required non-linearity and has been widely used in EEPROM memories. Due to the unique physical properties of silicon (Si), the energy difference between the conduction band and the valence band is 1.1 eV. In silicon dioxide ($SiO_2$), the energy difference between these bands is about 8.1 eV, with the conduction band in $SiO_2$ 3.2 eV above that in Si. Since electron energy is about 0.025 eV at thermal room temperature, the probability that an electron in Si can gain enough thermal energy to surmount the Si-to- $SiO_2$ barrier and enter the conduction band in $SiO_2$ is very small. Thereby, if electrons are placed on a polysilicon floating gate surrounded by $SiO_2$, then this band diagram will by itself insure the retention of data.

By taking advantage of this Fowler-Nordheim tunneling principle, a specific EEPROM memory cell, typically comprised of a single transistor, can be addressably programmed by applying electrical signals to a specified row and a specified column of the memory array matrix. For example, to write a logic "1" or a logic "0" into a memory cell, a voltage is applied to the control gate corresponding to the row (word line) of the selected cell, while a voltage corresponding to either a "1" or a "0" is applied to the source or drain corresponding to the column (bit line) of the selected cell. At the same time, other memory cells are prevented from being written to by applying specific voltages to their word and bit lines such that they become write inhibited. Likewise, particular memory cells can be erased while others are prevented from being erased (erase inhibited) by applying the appropriate voltages to the designated word and bit lines. By selectively applying voltages to the word and bit lines, memory cells can be read from, written to, write inhibited, erased, and erase inhibited.

As the design of EEPROM cells evolved, it has become possible to pack more and more memory cells into a single EEPROM chip. However, the increased density and efficiency of EEPROM cells has come at the expense of complexity. FIG. 1 shows an exemplary prior art EEPROM cell. It is described in the U.S. Pat. No. 5,379,253 "High Density EEPROM Cell Array With Novel Programming Scheme And Method Of Manufacture," issued to inventor Albert Bergemont, Jan. 3, 1995. It can be seen that this EEPROM cell design call for the use of multiple layers, including multiple polysilicon layers. Each additional layer dramatically increases the complexity for fabricating such a EEPROM cell. Although the complexity of a single memory cell has increased, scaling this memory cell design across a huge array has proven to be quite profitable because the memory needs of many applications necessitate the use of dedicated, high density EEPROM chips.

Sometimes though, EEPROM cells are used in analog applications, such as in trimming capacitors, resistors, etc. Utilizing a traditional EEPROM cell in these types of core CMOS analog applications is not cost-efficient. This is because the state-of-the-art EEPROM cell layout and structure has been optimized for stand-alone EEPROM chips. It is extremely difficult to embed these stand-alone EEPROM cells for use on core CMOS analog applications due to the complexity to fabricate them. Conventional stand alone EEPROM cell designs typically involved having a double polysilicon process with high voltage enhancement and depletion transistors. As such, they are not ideally suited for limited use in certain analog applications.

Thus, there exists a need in the prior art for a cost-effective EEPROM cell solution which can readily be embedded on core CMOS for analog applications. The present invention provides a process for fabricating low cost, full feature EEPROM cells which satisfy this need.

SUMMARY OF THE INVENTION

The present invention pertains to a process of fabricating an electrically erasable programmable read only memory cell embedded on core complementary metal oxide silicon for analog applications. First, a P-well region is formed. Two spaced-apart N-well regions are formed within the P-well. A first field oxide layer is deposited over the P-well and two N-wells. A high-voltage oxide layer is then grown over the first field oxide layer. A first photoresist mask which defines a tunneling window is then overlaid. The first field oxide layer and the high-voltage oxide layer are then etched. Afterwards, the first photoresist mask is stripped away. A tunnel oxide layer is grown. A polysilicon layer is grown on top of the tunnel oxide layer and doped. A second photoresist mask which defines a floating gate is overlaid on top of the polysilicon layer. The polysilicon layer is then etched, and the second photoresist mask is stripped away. Thereby, only a single polysilicon layer and masking step is required to manufacture the embedded EEPROM memory cell according to the present invention.

In one embodiment, the process can be used to fabricate an array of at least four EEPROM memory cells. This is accomplished by utilizing an N-well mask having at least three regions which defines a first N-well region, a second N-well region, and a third N-well region. The first N-well region and the third N-well region act as coupling areas and the second N-well region acts as tunnel window regions for the EEPROM memory cell array. A first photoresist mask defines at least four tunnel window regions, one tunnel window region in each of four P+ regions residing within the second N-well. The second photoresist mask defines at least four T-shaped floating gates corresponding to four EEPROM cells, wherein each of the floating gates extends from one tunneling window residing within one N-well to another N-well. Furthermore, the second photoresist mask also defines one or more high-voltage transistors. Additionally, logic gates may be fabricated over the EEPROM memory cell array by mask protecting the EEPROM memory cells and then depositing an oxide layer.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 8 shows a chart listing the voltages that need to be applied to each of the bit lines and various N-wells in order to selectively program the various EEPROM cells of the memory array.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Figure 1:
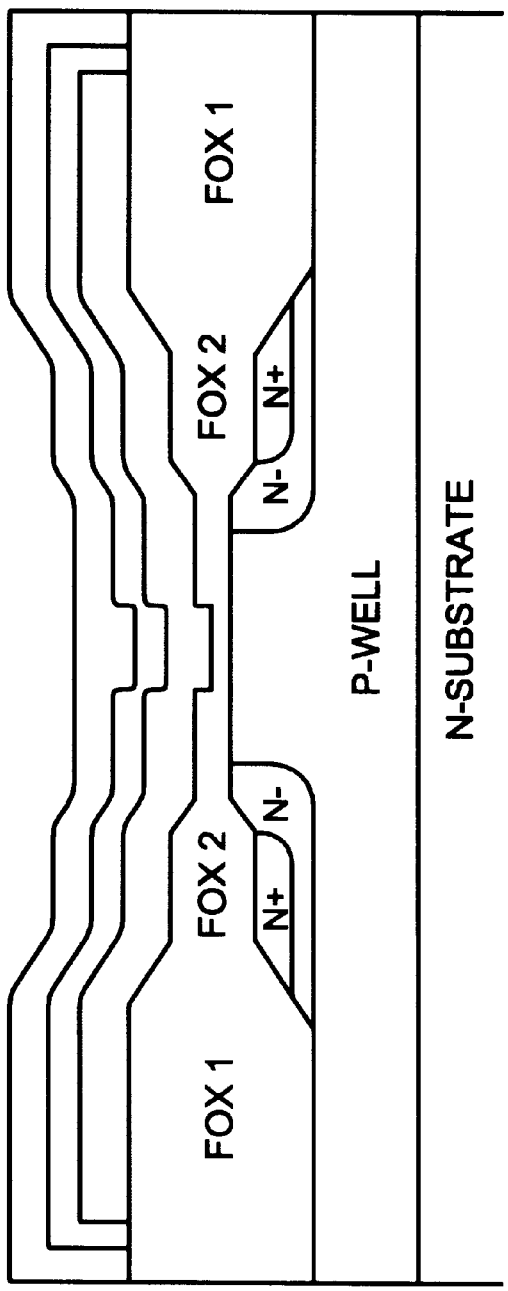
FIG. 1 shows an exemplary prior art EEPROM cell.
Figure 2:
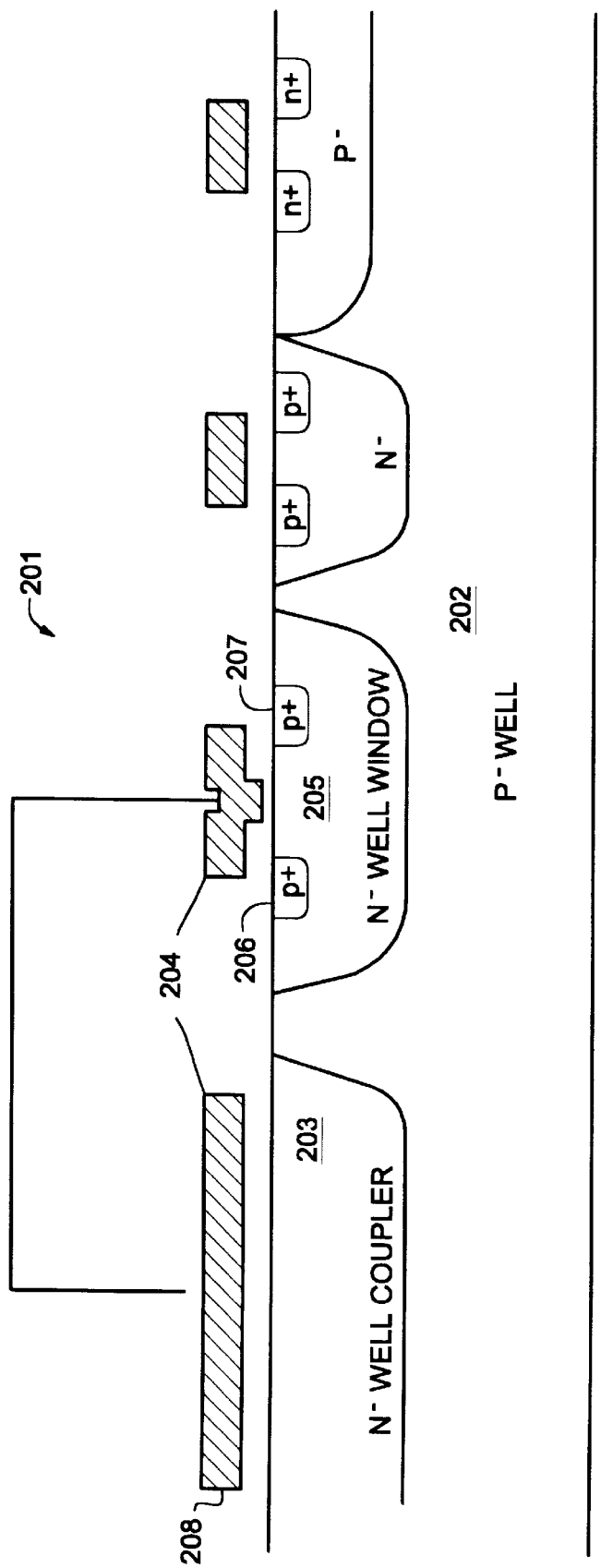
FIG. 2 shows a cross-section of the currently preferred embodiment of the EEPROM cell of the present invention.

Referring to FIG. 2, a cross-section of the currently preferred embodiment of the EEPROM cell of the present invention is shown. The EEPROM cell 201 is fabricated from complementary metal-oxide semiconductor (CMOS) logic, which utilizes the electrical properties of both n-type as well as p-type semiconductors. Basically, EEPROM cell 201 resides within a P-well 202. An N-well region 203 resides within the P-well 202. N-well region 203 is used as a coupling area to the floating gate 204. Another separate N-well region 205 is formed within P-well 202. N-well region 205 serves as a tunneling window to tunnel charges to and from the floating gate 204. Since EEPROM cell 201 is a P channel device, charges transferred in and out of the floating gate 204 are holes and not electrons. Disposed within the N-well window region 205 are two separate P+ regions 206 and 207. The two P+ regions 206 and 207 act as bit lines. It should be noted that the EEPROM cell 201 is a single poly cell in that only one poly gate logic layer 208 (for the floating gate 204) is need to construct the cell. Comparing the structure of the EEPROM cell 201 of the present invention with that of the prior art EEPROM cell as shown in FIG. 2, it is clear that the EEPROM cell of the present invention is less complex. As such, the EEPROM cell 201 of the present invention is easier to fabricate and accordingly, less costly to manufacture.

Figure 3:
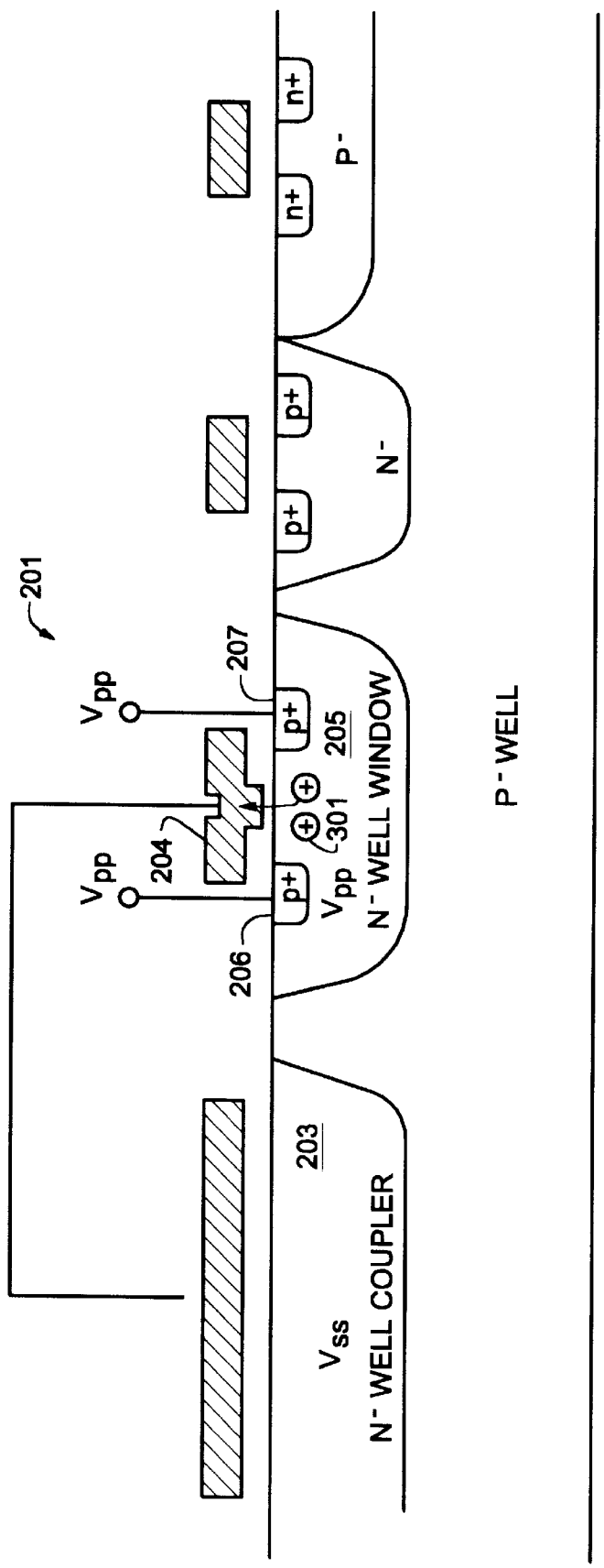
FIG. 3 shows the write operation for the EEPROM cell according to one embodiment of the present invention.
Figure 4:
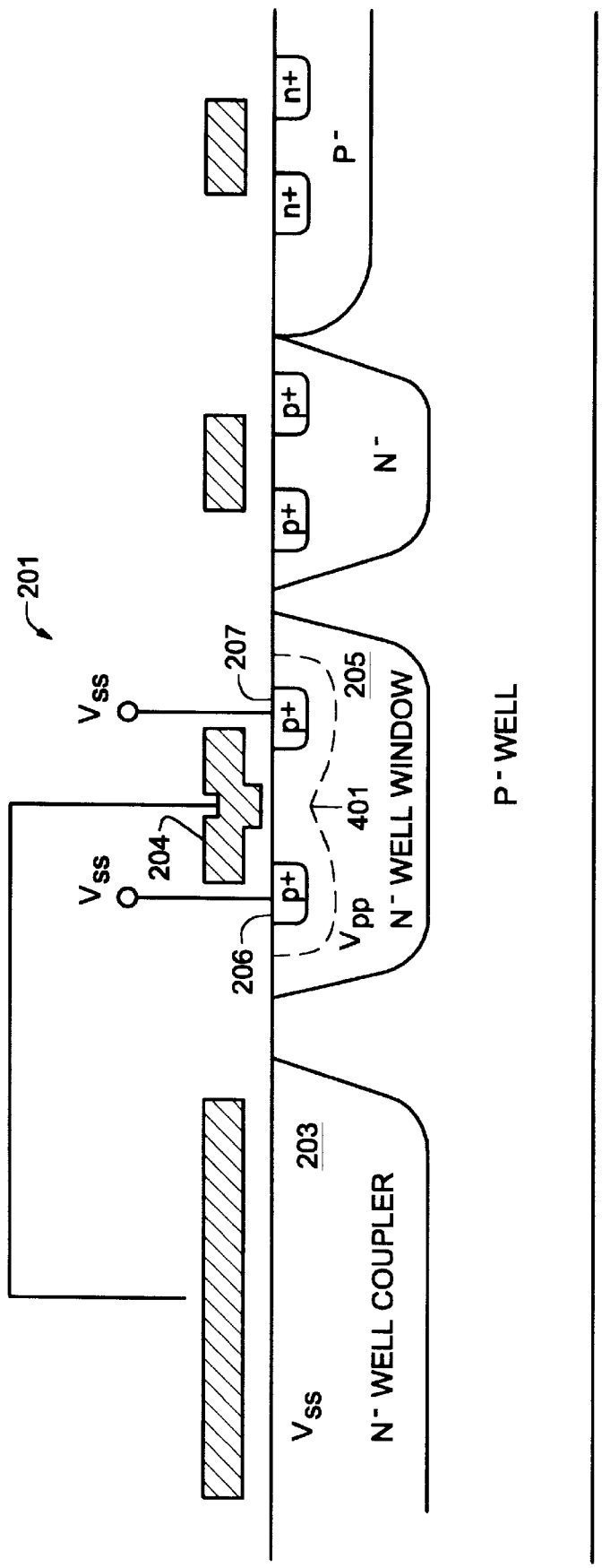
FIG. 4 shows a write inhibit operation for the EEPROM cell according to one embodiment of the present invention.
Figure 5:
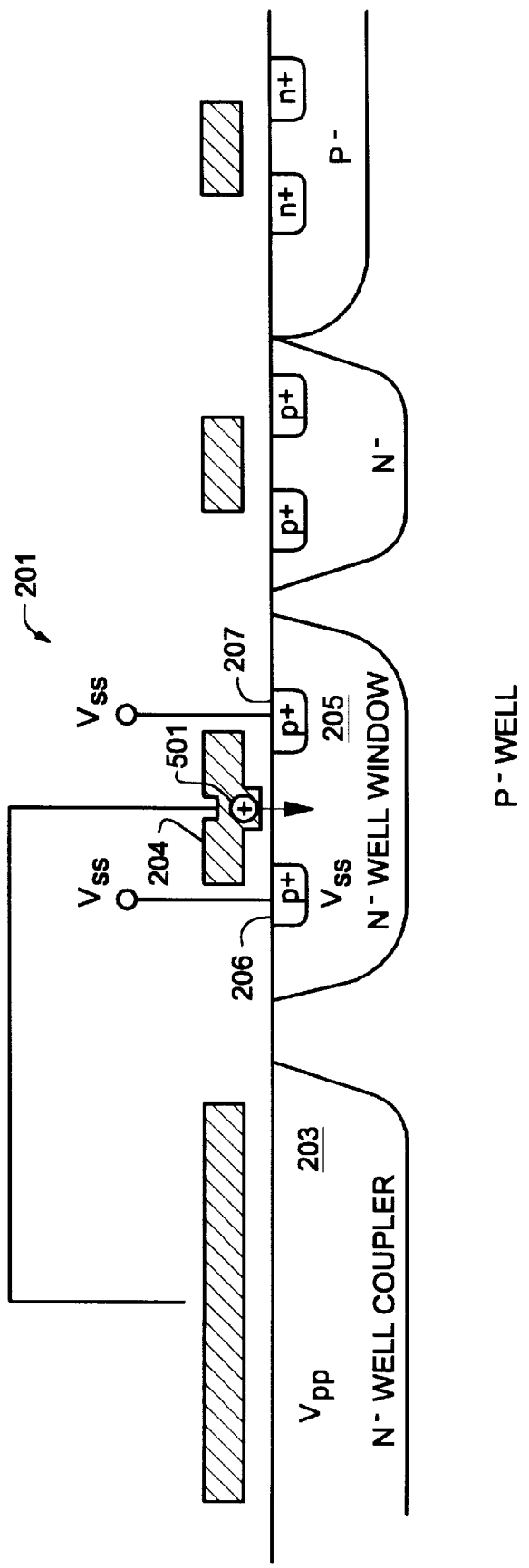
FIG. 5 shows an erase operation for the EEPROM cell according to one embodiment of the present invention.

Even though the EEPROM cell of the present invention is less complex, and less costly to fabricate, it nonetheless retains full functionality of a EEPROM device. FIGS. 3–5 show the operations of the EEPROM cell according to one embodiment of the present invention. By applying specific voltages to specific parts of the EEPROM cell, the EEPROM cell can be programmed to perform the operations of write, write inhibit, and erase.

In particular, FIG. 3 shows the write operation for the EEPROM cell according to one embodiment of the present invention. In order to write to the EEPROM cell 201, Vss is placed on the N-well coupler 203. The N-well window 205 is placed at Vpp. The two P+ regions 206 and 207 are placed at Vpp. The resulting inverted channel causes holes to be formed. These holes 301 are injected into the floating gate 204. Thereby, the holes stored by the floating gate 204 represents a "1" being written to EEPROM cell 201.

FIG. 4 shows a write inhibit operation for the EEPROM cell according to one embodiment of the present invention. The write inhibit function prevents a cell from being written when a write operation is conducted on another nearby or adjacent cell. The EEPROM cell 201 is write inhibited by placing Vss on the N-well coupler 203. The N-well window 205 is placed at Vpp. And the two P+ regions 206 and 207 are placed at Vss. This causes the P+ junctions to become reverse biased, thereby forming a 4 depletion region 401. Depletion region 401 prevents holes from being injected into the floating gate 204. Moreover, there is no charge at the surface. This essentially acts to write inhibit cell 201.

FIG. 5 shows an erase operation for the EEPROM cell according to one embodiment of the present invention. The N-well coupler 203 is placed at Vpp. The N-well window 205 is placed at Vss. And the two P+ regions 206 and 207 are placed at Vss. This forces holes 501 to be pushed away from the floating gate 204. Thereby, the memory cell 201 is effectively erased.

Figure 6:
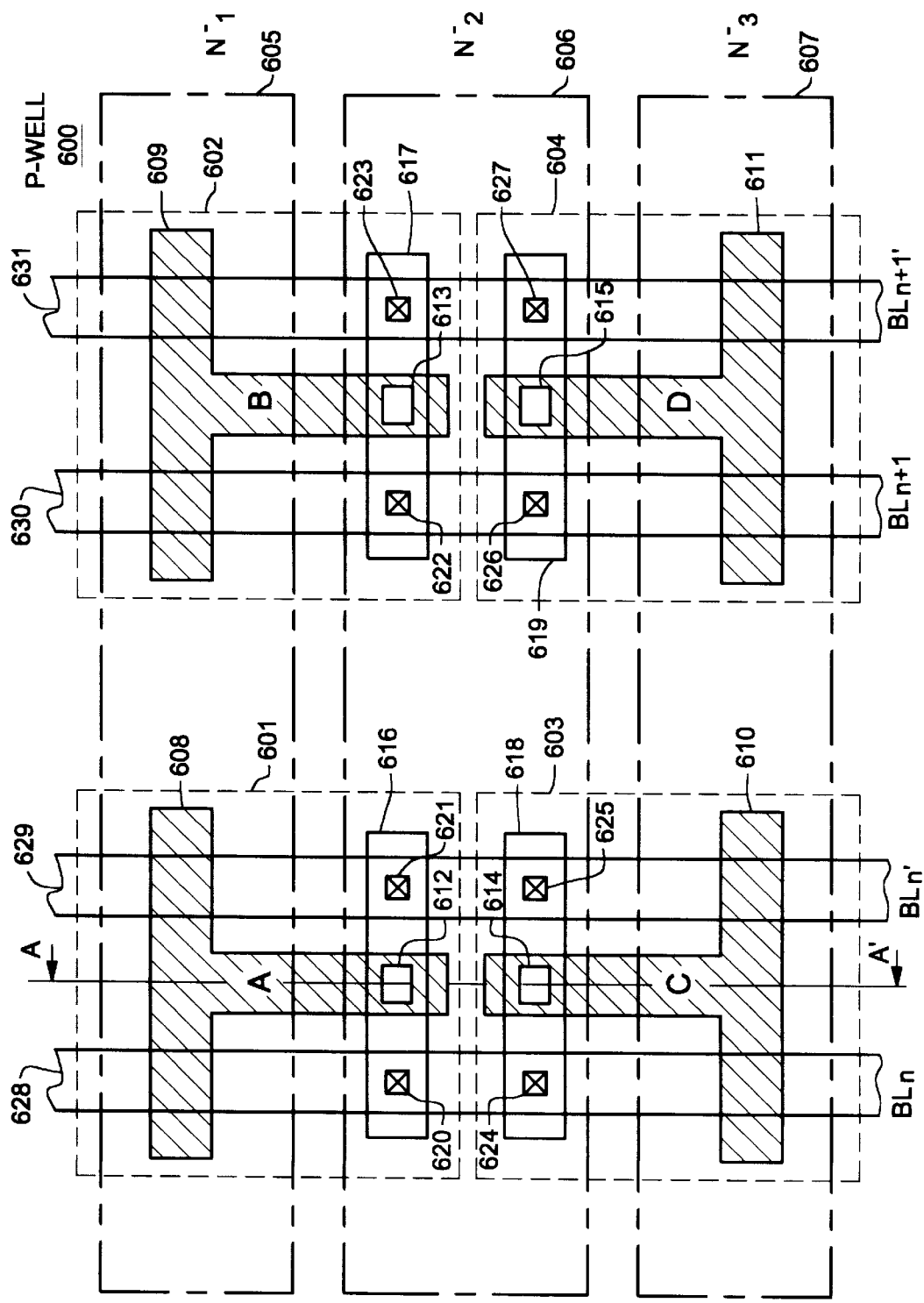
FIG. 6 shows a portion of an exemplary novel EEPROM cell layout embedded on Core CMOS according to one embodiment of the present invention.

The EEPROM cell layout of the present invention can be implemented in an array, whereby multiple EEPROM cells can be fabricated at the same time. FIG. 6 shows a portion of an exemplary novel EEPROM cell array embedded on Core CMOS according to one embodiment of the present invention. The layout depicted in FIG. 6 shows an array having four EEPROM cells 601–604. However, it should be noted that this same type of layout can accommodate many more EEPROM cells.

A single poly layer is used to fabricate the floating gates of each of the four EEPROM cells. For example, poly 608 is used to fabricate the floating gate of EEPROM memory cell 601; poly 609 is used to fabricate the floating gate of EEPROM memory cell 602; poly 610 is used to fabricate the floating gate of EEPROM memory cell 603; and poly 611 is used to fabricate the floating gate of EEPROM memory cell 604. The floating gates of each of the EEPROM memory cells extend from one N-well region to a different N-well region. In this embodiment, three N-well regions (N-1, N-2, and N-3) 605–607 are used in the fabrication of the four EEPROM memory cells 601–604. All three N-wells reside within a P-well 600. The floating gate 608 of EEPROM memory cell 601 extends from the N-1 well 605 to the N-2 well 606. In this case, the N-1 well 605 acts as a well coupler whereas the N-2 well 606 acts as a well window for EEPROM memory cell 601. The tunneling window for EEPROM memory cell 601 is shown as 612. Likewise, for EEPROM memory cell 602, its floating gate 609 extends from the N-1 well 605 to the N-2 well 606. Similarly, the N-1 well 605 acts as a well coupler whereas the N-2 well 606 acts as a well window for EEPROM memory cell 602. The tunneling window for EEPROM memory cell 602 is shown as 613.

For memory cell 603, its floating gate 610 extends from the N-3 well 607 to the N-2 well 606. In this case, the N-3 well 607 acts as a well coupler whereas the N-2 well 606 acts as a well window for EEPROM memory cell 603. The tunneling window for EEPROM memory cell 603 is shown as 614. Likewise, for EEPROM memory cell 604, its floating gate 6011 extends from the N-3 well 607 to the N-2 well 606. Similarly, the N-3 well 607 acts as a well coupler whereas the N-2 well 606 acts as a well window for EEPROM memory cell 604. The tunneling window for EEPROM memory cell 604 is shown as 615.

Each of the four EEPROM memory cells has its own P+ region. For example, EEPROM memory cell 601 includes P+ region 616. EEPROM memory cell 602 has P+ region 617. EEPROM memory cell 603 has P+ region 618. And EEPROM memory cell 604 has P+ region 619. Each of the P+ regions 616–619 reside within the N-2 well 606.

Coupled to each of these P+ regions are pairs of bit lines. These bit lines are used to control the voltages applied to the P+ regions. For example, bit line 628 is coupled to the P+ region 616 through contact 620 while bit line 629 is also coupled to the P+ region 616 of EEPROM memory cell 601 by means of contact 621. EEPROM memory cell 603 shares the same two bit lines 628 and 629 with EEPROM memory cell 601. Namely, bit line 628 is also coupled to the P+ region 618 of EEPROM memory cell 603 by means of contact 624, and bit line 629 is also coupled to the P+ region 618 of EEPROM memory cell 603 by means of bit line contact 629. A second pair of bit lines 630 and 631 are coupled to the P+ regions 617 and 619 of EEPROM memory cells 602 and 603. Specifically, bit line 630 is coupled to the P+ region 617 of EEPROM memory cell 602 by means of contact 622, and bit line 631 is also coupled to the P+ region 617 of EEPROM memory cell 602 by means of contact 623. Likewise, bit line 630 is coupled to the P+ region 619 of EEPROM memory cell 604 by means of contact 626. And bit line 631 is coupled to the P+ region 619 of EEPROM memory cell 604 by means of bit line contact 627.

It can be seen then that EEPROM memory cell 601 is fabricated from an N-1 well coupler region 605 and an N-2 well window 606. Both the N-1 well coupler region 605 and the N-2 well window 606 reside within the P-well 600. A single poly layer 608 forms the floating gate. The poly layer 608 extends from the N-1 well coupler 605, over the P-well 600, to the N-2 well window 606. A tunneling window 612 is provided from the N-2 well window 606 to the poly 608 of the floating gate. It is through this tunneling window 612 that holes are injected to and dissipated from the floating gate poly 608. A P+ region 616 is disposed within the N-2 well 606. Two bit line contacts 620 and 621 are used to couple the two bit lines 628 and 629 to the P+ region 616.

Likewise, EEPROM memory cell 602 is fabricated from an N-1 well coupler region 605 and an N-2 well window 606. Both the N-1 well coupler region 605 and the N-2 well window 606 reside within the P-well 600. A single poly layer 609 forms the floating gate. The poly layer 609 extends from the N-1 well coupler 605, over the P-well 600, to the N-2 well window 606. A tunneling window 613 is provided from the N-2 well window 606 to the poly 609 of the floating gate. It is through this tunneling window 613 that holes are injected to and dissipated from the floating gate poly 609. A P+ region 617 is disposed within the N-2 well 606. Two bit line contacts 622 and 623 are used to couple the two bit lines 626 and 627 to the P+ region 617.

EEPROM memory cell 603 is fabricated from an N-3 well coupler region 607 and an N-2 well window 606. Both the N-3 well coupler region 607 and the N-2 well window 606 reside within the P-well 600. A single poly layer 610 forms the floating gate. The poly layer 610 extends from the N-3 well coupler 607, over the P-well 600, to the N-2 well window 606. A tunneling window 614 is provided from the N-2 well window 606 to the poly 610 of the floating gate. It is through this tunneling window 614 that holes are injected to and dissipated from the floating gate poly 610. A P+ region 618 is disposed within the N-2 well 606. Two bit line contacts 624 and 625 are used to couple the two bit lines 628 and 629 to the P+ region 618.

Lastly, EEPROM memory cell 604 is fabricated from an N-3 well coupler region 607 and an N-2 well window 606. Both the N-3 well coupler region 607 and the N-2 well window 606 reside within the P-well 600. A single poly layer 611 forms the floating gate. The poly layer 611 extends from the N-3 well coupler 607, over the P-well 600, to the N-2 well window 606. A tunneling window 615 is provided from the N-2 well window 606 to the poly 611 of the floating gate. It is through this tunneling window 615 that holes are injected to and dissipated from the floating gate poly 611. A P+ region 619 is disposed within the N-2 well 606. Two bit line contacts 626 and 627 are used to couple the two bit lines 630 and 631 to the P+ region 618.

Figure 7:
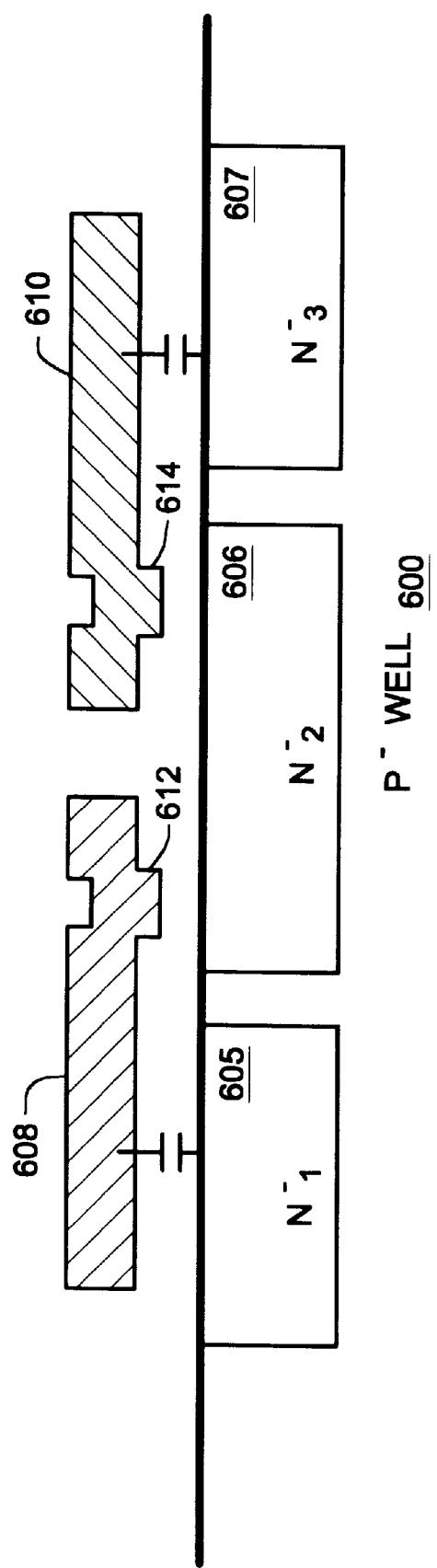
FIG. 7 shows a cross-sectional view of the EEPROM memory cell array according to the currently preferred embodiment of the present invention.

FIG. 7 shows a cross-sectional view of the EEPROM memory cell array according to the currently preferred embodiment of the present invention. The diagram shows an AA' cross-section of the EEPROM memory cell as depicted in FIG. 6. The N-1 well 605, N-2 well 606, N-3 well 607 all reside within the P-well 600. The floating gate of the EEPROM memory cell 601 is shown as poly 608. Poly 608 extends from above the N-1 well 605, over the P-well 600, and over to above the N-2 well 606. Note that the tunneling window 612 is used to inject holes into and expel holes out from the floating gate. In similar fashion, the floating gate of the EEPROM memory cell 602 is shown as poly 610. Poly 610 extends from above the N-1 well 607, over the P-well 600, and over to above the N-2 well 606. A tunneling window 614 is used to inject holes into and expel holes out from the floating gate.

FIG. 8 shows a chart listing the voltages that need to be applied to each of the bit lines and various N-wells in order to selectively program the various EEPROM cells of the memory array. In particular, it can be seen that in order to write to cell A (EEPROM memory cell 601), the bit line BLn (bit line 628) must be set at Vpp; the bit line BLn' (bit line 629) must be set at Vpp; the N-1 (well 605) must be set at Vss; and the N-2 (well 606) must be set at Vpp. While writing to cell A, the remaining four cells B-D can be write inhibited as follows. To write inhibit cell B (EEPROM memory cell 602), the bit line BLn+1 (bit line 630) must be set to Vss; the bit line BLn+1' (bit line 631) must be set to VSS; the N-1 (well 605) must be set to Vss; and the N-2 (well 606) must be set to Vpp. To write inhibit cell C (EEPROM memory cell 603), the bit line BLn (bit line 628) must be set to Vpp; the bit line BLn' (bit line 629) must be set to Vpp; the N-2 (well 606) must be set to VPP; and the N-3 (well 607) must be set to Vpp. In order to write inhibit cell D (EEPROM memory cell 604), the bit line BLn+1 (bit line 630) must be set to Vss; the bit line BLn+1' (bit line 631) must be set to Vss; the N-2 (well 606) must be set to Vpp; and the N-3 (well 607) must be set to Vpp.

In the currently preferred embodiment of the present invention, an entire block of cells can be erased at the same time. For instance, cells A and B (EEPROM memory cells 601 and 602) can concurrently be erased. This is accomplished by placing all four of the bit lines (BLn 628, BLn' 629, BLn+1 630, and BLn+1' 631) at Vss; the N-1 (well 605) is placed at Vpp; and the N-2 (well 606) is placed at Vss. The other cells C and D (EEPROM memory cells 603 and 604) can be erase inhibited by placing all four of the bit lines (BLn 628, BLn' 629, BLn+1 630, and BLn+1' 631) at Vss; the N-2 (well 606) is placed at Vss; and the N-3 (well 607) is placed at Vss.

Figure 9:
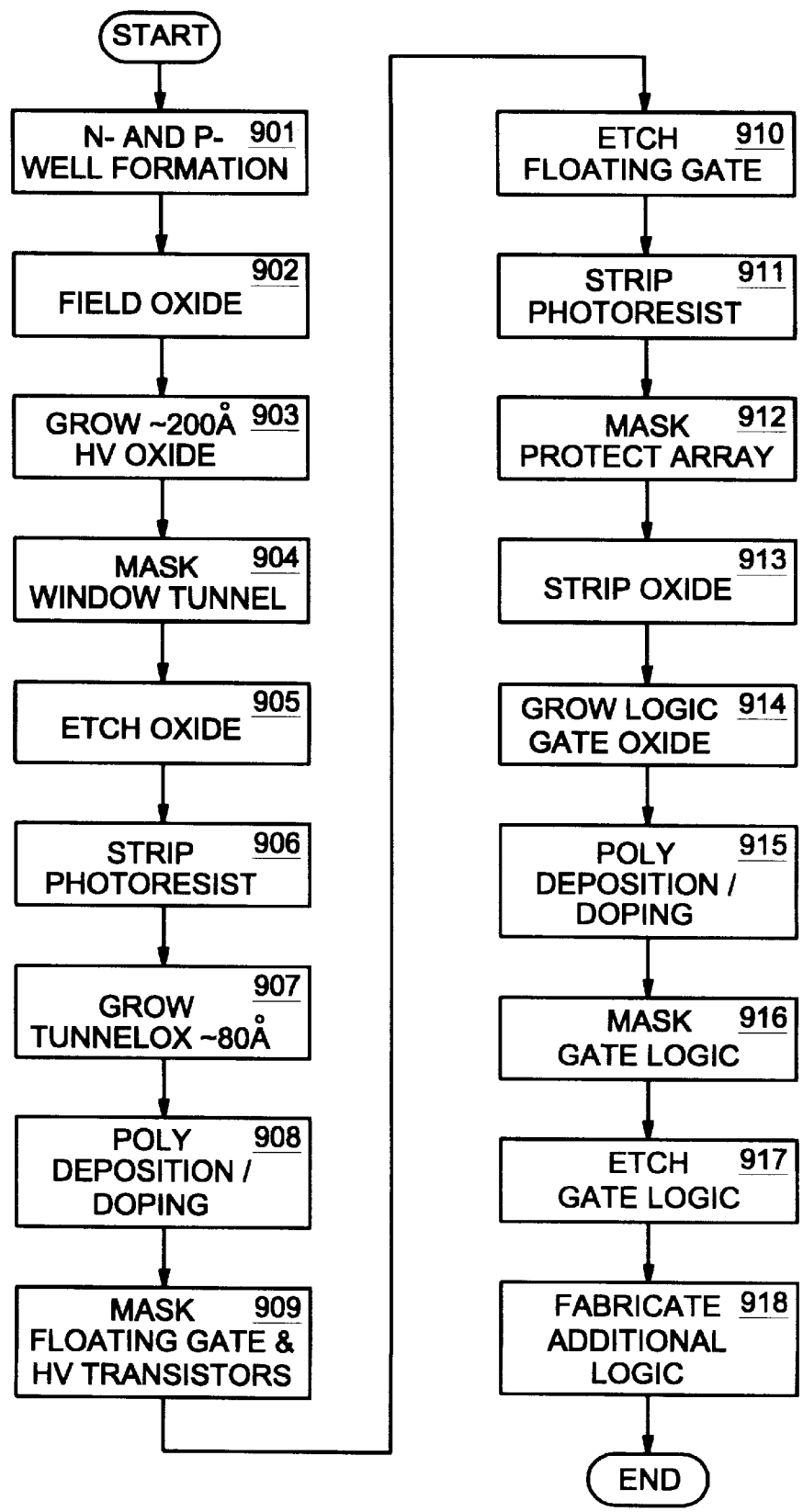
FIG. 9 is a flowchart describing the steps of the fabrication process for manufacturing the EEPROM memory cell array according to the currently preferred embodiment of the present invention.

A low-cost process to fabricate the EEPROM memory cell array described above is now disclosed. FIG. 9 is a flowchart describing the steps of the fabrication process for manufacturing the EEPROM memory cell array according to the currently preferred embodiment of the present invention. Step 901 entails forming the P+, P-, and N-wells. Although not listed in the flowchart for purposes of brevity and clarity, it will be understood that various other process steps may be performed prior to the formation of the P+, P-, and N-wells. These steps may include, for example, but are not limited to, planarizing the semiconductor wafer into which the P+, P-, and N-wells are to be formed. Such planarization can be accomplished by, for example, using chemical mechanical polishing (CMP) or various other methods well suited to providing a level topography at the top surface of the semiconductor wafer. Additionally, the present invention is also well suited to an embodiment in which a virgin silicon surface is achieved prior to the forming the P+, P-, and N-wells. Such a virgin surface is achieved in one embodiment by, for example, growing, and subsequently removing, a sacrificial oxide layer. As mentioned above, for purposes of brevity and clarity, various conventional fabrication steps associated with the fabrication of a semiconductor device are not recited in the following description.

Referring still to step 901, the P+, P-, and N-wells are formed according to conventional CMOS technology. These conventional CMOS device fabrication steps include, for example, a dopant implantation step and a rapid thermal anneal (RTA). Applying conventional CMOS techniques, an initial field oxide layer is then grown over these wells in step 902. These two steps 901 and 902 result in the formation of P-well 202, N-well coupler 203, N2 well window 205, and the two P+ regions 206-207 as shown in FIG. 2.

Next, a high-voltage (HV) oxide layer of approximately 200 Å thickness is overlaid on top of the initial field oxide layer, step 903. In step 904, the oxide is masked with a photoresist which is patterned to expose regions of the underlying oxide regions in order to define the tunneling windows. The oxide is then etched, step 905. The present embodiment is well suited to using any of the various etch technologies to form the tunneling windows. These etch technologies include but are not limited to, wet etch, dry etch, reactive ion etching, plasma etch, and the like.

At step 906, after the etching is completed, the photoresist is stripped. Thereupon, a tunnel oxide layer of approximately 80 Å thickness is grown, step 907. A polysilicon layer is then deposited and doped, step 908. This polysilicon layer is masked with a photoresist having a pattern defining the floating gates and high voltage transistors, step 909. An etching process is performed in step 910 to make the floating gates. Afterwards, the photoresist is stripped away, step 911. It should be noted that steps 903–911 define the unique, novel process for fabricating the EEPROM memory cell array according to the present invention. Of particular significance is the fact that the EEPROM memory cell array can be fabricated with a single polysilicon layer in contrast to two or more such poly layers as taught by the prior art. Moreover, the EEPROM memory cell array of the present invention only needs two masks in addition to the standard CMOS device fabrication masks. Hence, the present single polysilicon layer EEPROM can be fabricated with little perturbation from the standard CMOS process flow. Prior art processes typically require at least three or more separate masks.

Once the EEPROM memory cell array has been fabricated according to steps 903–911, additional layers can be added to implement other logic onto the same chip. For instance, the EEPROM memory cell array can be mask protected, step 912. The oxide layer is stripped, step 913. Thereafter, a logic gate oxide layer can be grown, step 914. A mask of the gate logic is overlayed, step 916. The gate logic is then etched, step 917. Additional steps may be performed to achieve the desired logic, step 918. It should be noted that standard CMOS process steps can be performed to implement any logic desired, including analog and/or digital applications. Thereby, the process for fabricating EEPROM memory cell array embedded within core CMOS has been disclosed.

Figure 10:
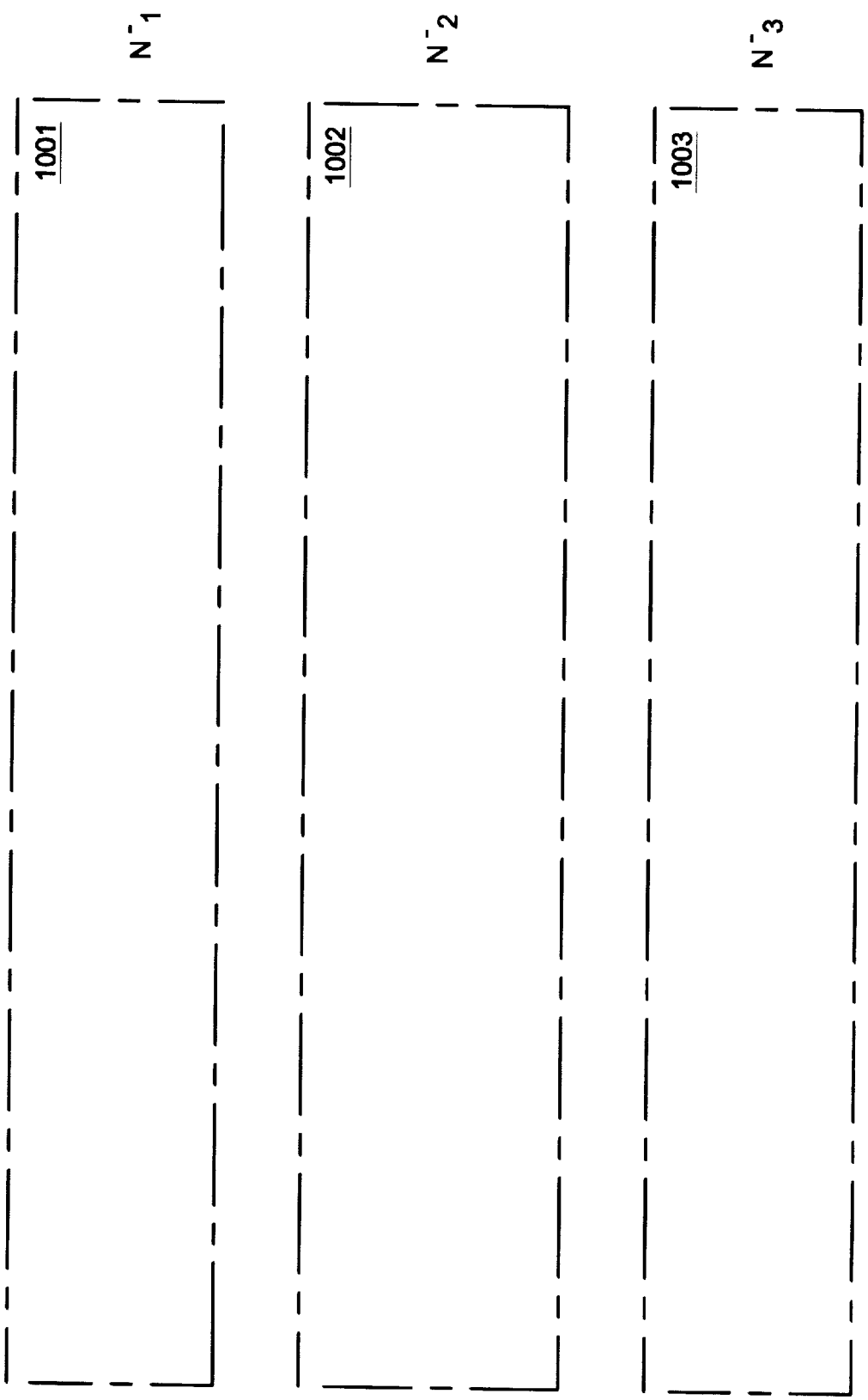
FIG. 10 shows an exemplary mask as may be used to fabricate the three N-wells.
Figure 11:
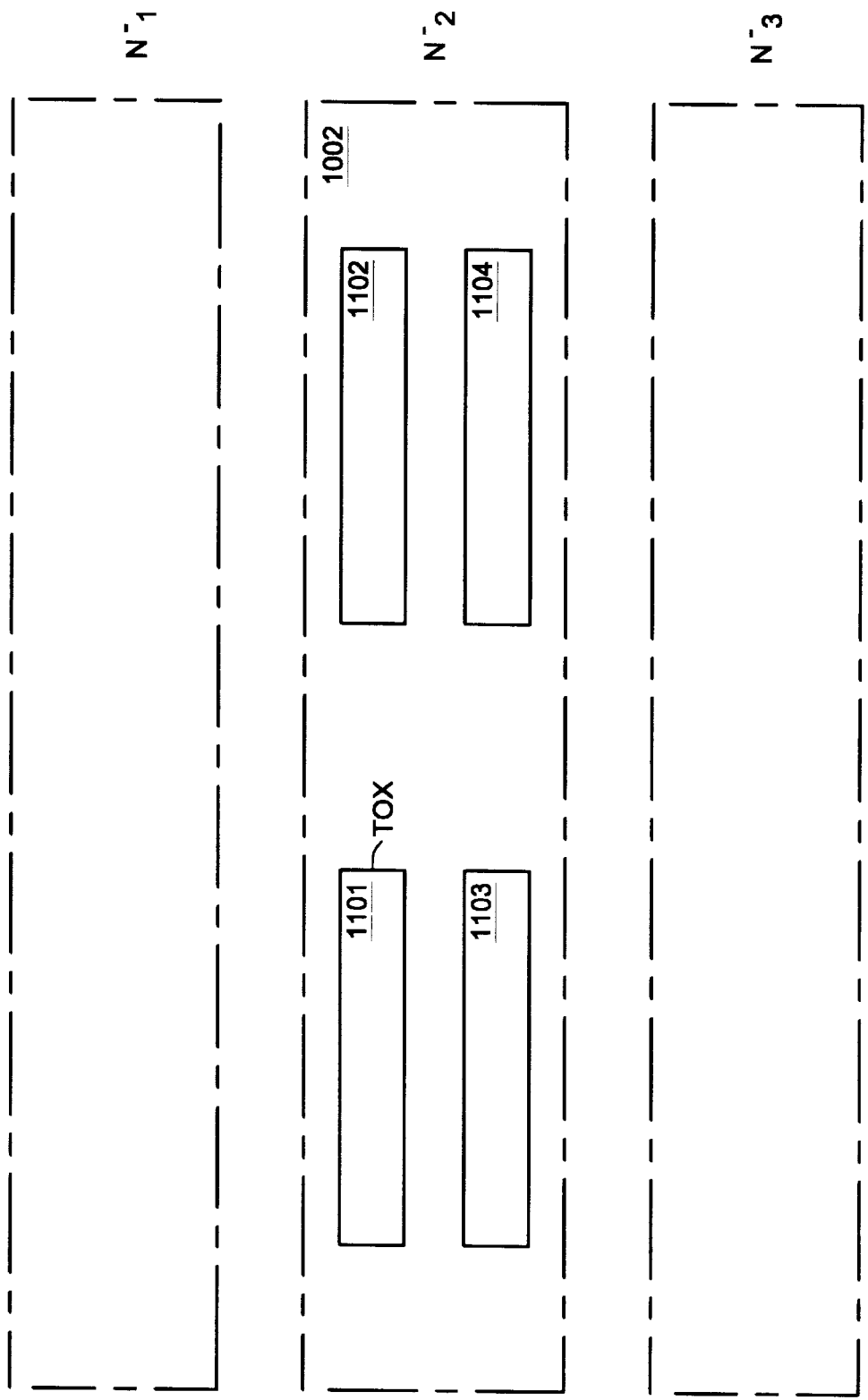
FIG. 11 shows an exemplary mask as may be used to fabricate the field oxide formation.
Figure 12:
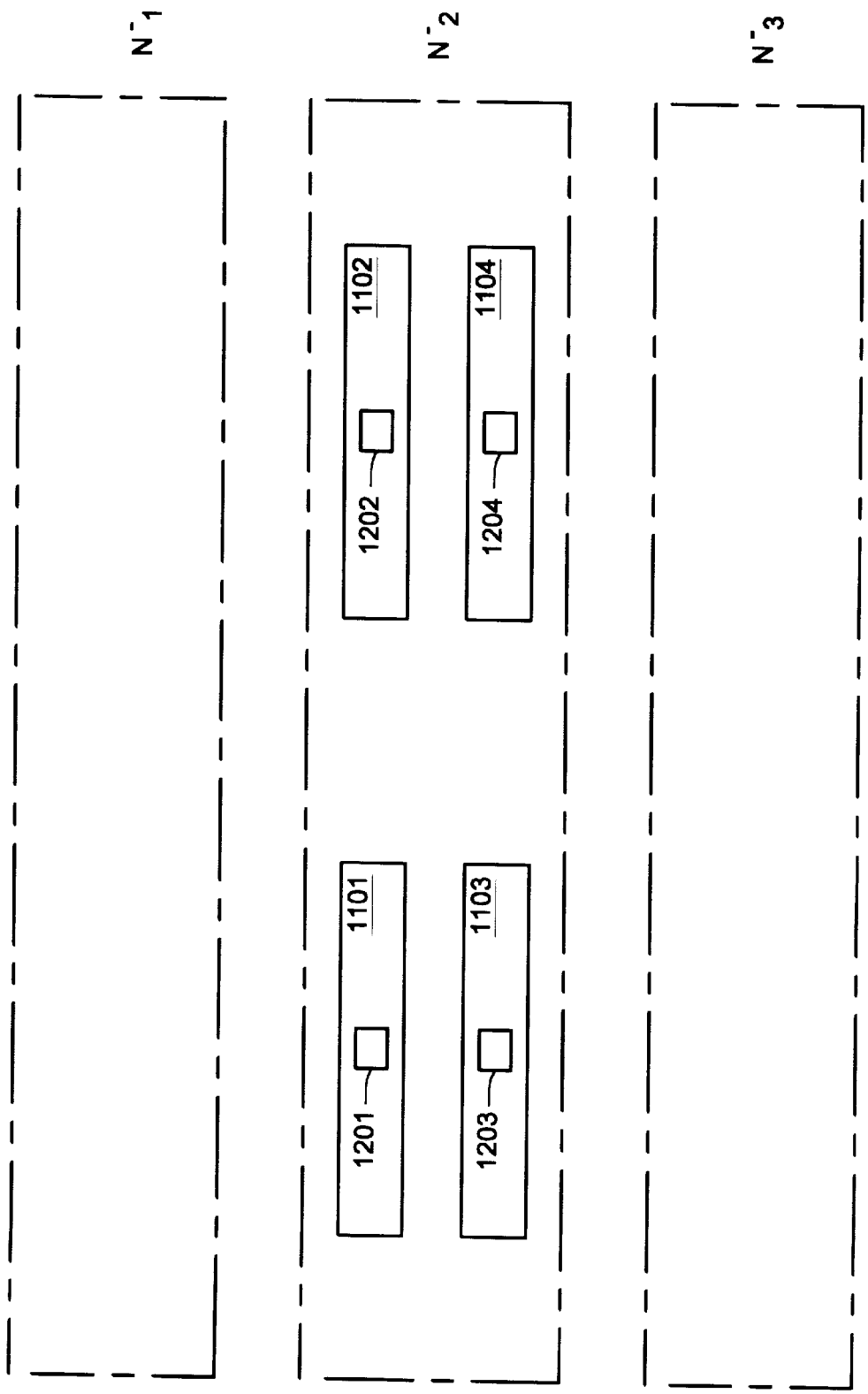
FIG. 12 shows an exemplary mask as may be used to fabricate the four tunnel windows.
Figure 13:
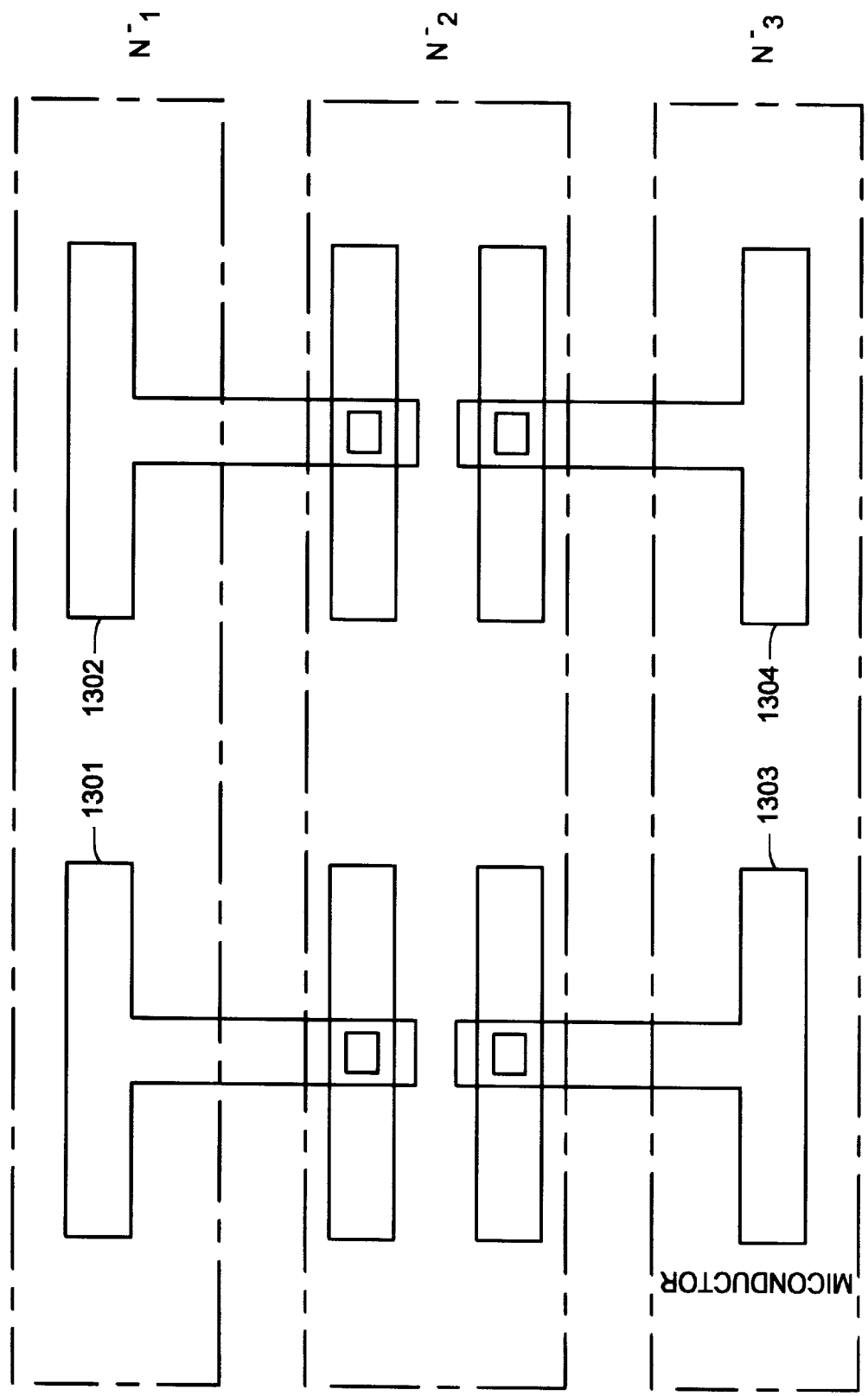
FIG. 13 shows an exemplary polysilicon mask as may be used to fabricate the floating gates.

FIGS. 10–13 show the various masks associated for fabricating the EEPROM memory cell array of the present invention. In particular, FIG. 10 shows an exemplary mask as may be used to fabricate the three N-wells (e.g., N-wells 605–607 of FIG. 6). The mask is comprised of three rectangular regions 1001, 1002, and 1003. These three rectangular regions 1001–1003 correspond to the three N-wells. FIG. 11 shows an exemplary mask as may be used to fabricate the field oxide formation. The four rectangular regions 1101–1104 are used for the tunnel oxide formation corresponding to the four P+ regions 616–619. These four tunnel oxide formation regions 1101–1104 reside within the N-2 well 1102. FIG. 12 shows an exemplary mask as may be used to fabricate the four tunnel windows (e.g., tunnel windows 612–615). Four rectangular regions 1201–1204 exist within each of the four respective field oxide regions 1101–1104. FIG. 13 shows an exemplary polysilicon mask as may be used to fabricate the floating gates. The four T-shaped polysilicon areas 1301–1304 define the floating gates 608–611. Together, these four masks are used in conjunction with standard CMOS layering, patterning, doping, and heat treatment processes to fabricate the EEPROM memory cell array of the present invention. Although specific shapes for the various areas of the single polysilicon layer device are listed above, the present embodiment is well suited to the use of various other mask shapes and sizes.

Therefore, the preferred embodiment of the present invention, a process to fabricate low cost EEPROM cells embedded on core CMOS for analog applications is thus described. While the present invention has been described in particular embodiments, it should be appreciated that the present invention should not be construed as limited by such embodiments, but rather construed according to the below claims.

Therefore, the preferred embodiment of the present invention, a process to fabricate low cost EEPROM cells embedded on core CMOS for analog applications is thus described. While the present invention has been described in particular embodiments, it should be appreciated that the present invention should not be construed as limited by such embodiments, but rather construed according to the below claims.

What is claimed is:

1. A process of fabricating an electrically erasable programmable read only memory cell, comprising the steps of:
   forming a P-well, a first N-well within the P-well, and a second N-well within the P-well spaced apart from the first N-well;
   depositing a first field oxide layer over the P-well, the first N-well, and the second N-well;
   growing a high-voltage oxide layer over the first field oxide layer;
   overlaying a first photoresist mask which defines a tunneling window;
   etching the first field oxide layer and the high-voltage oxide layer;
   stripping the first photoresist mask;
   growing a tunnel oxide layer;
   depositing a polysilicon layer;
   doping the polysilicon layer;
   overlaying a second photoresist mask which defines a floating gate;
   etching the polysilicon layer;
   stripping the second photoresist mask.

2. The process of claim 1 further comprising the step of embedding the EEPROM memory cell on core complementary metal oxide silicon for analog applications.

3. The process of claim 1 further comprising the steps of:
   forming two P+wells within the second P-well
   forming contacts to the two P+wells, wherein two bit lines are coupled to the two P+wells.

4. The process of claim 1, wherein the high-voltage oxide layer is approximately 200 angstroms.

5. The process of claim 1, wherein the tunnel oxide layer is approximately 80 angstroms.

6. The process of claim 1, wherein the second photoresist mask further defines a high-voltage transistor.

7. The process of claim 1 further comprising the step of overlaying an N-well mask over the P-well, the N-well mask having at least three regions which define a first N-well region, a second N-well region, and a third N-well region.

8. The process of claim 7, wherein the first N-well region and the third N-well region act as coupling areas for an array of at least four EEPROM memory cells.

9. The process of claim 7, wherein the first photoresist mask defines at least four tunnel window regions, one tunnel window region in each of four P+ regions residing within the second N-well.

10. The process of claim 1, wherein the second photoresist mask defines at least four T-shaped floating gates corresponding to four EEPROM cells, wherein each of the floating gates extends from one tunneling window residing within one N-well to another N-well.

11. The process of claim 1 further comprising additional steps to fabricate additional gate logic.

12. The process of claim 1, wherein the polysilicon layer is the only single polysilicon layer required to fabricate the EEPROM memory cell.

13. A method of manufacturing an electrically erasable programmable read only memory cell having a first well of P-type conductivity, an N-well coupler region formed within the first well of P-type conductivity, a N-well window region formed within the first well of P-type conductivity and spaced apart from the N-well coupler region, a first P+type region formed within the N-well window region, a second P+type region formed within the N-well window region and spaced apart from the first P+type region, a first contact which couples a first bit line to the first P+type region, a second contact which couples a second bit line to the second P+type region, and a single polysilicon layer disposed over the N-well coupler region and the N-well window region which defines a floating gate of the electrically erasable programmable read only memory cell, the method comprising the steps of:
   depositing a first field oxide layer over the first well of P-type conductivity, the N-well coupler region, and the N-well window region;
   growing a high-voltage oxide layer over the first field oxide layer;
   overlaying a first photoresist mask which defines a tunneling window;
   etching the first field oxide layer and the high-voltage oxide layer;
   stripping the first photoresist mask;
   growing a tunnel oxide layer;
   depositing a polysilicon layer;
   doping the polysilicon layer;
   overlaying a second photoresist mask which defines the floating gate;
   etching the polysilicon layer;
   stripping the second photoresist mask.

14. The method of claim 13 further comprising the step of embedding the EEPROM memory cell on core complementary metal oxide silicon for analog applications.

15. The method of claim 14, wherein only a single polysilicon layer is used in the fabrication of the EEPROM memory cell.

16. A method of fabricating an electrically erasable programmable read only memory cell array having a well of P-type conductivity, a first well of N-type conductivity residing within the well of P-type conductivity, a second well of N-type conductivity residing within the well of P-type conductivity spaced apart from the first well of N-type conductivity, a plurality of wells of P+type conductivity residing within the second well of N-type conductivity, a plurality of contacts coupling a plurality of bit lines to the plurality of wells of P+type conductivity, a third well of N-type conductivity residing within the well of P-type conductivity spaced apart from the first well of N-type conductivity and the second well of N-type conductivity, a single polysilicon layer disposed over the first well, the second well, and the third well, wherein the single polysilicon layer defines floating gates for a plurality of electrically erasable programmable read only memory cells of the array, the method comprising the steps of:

depositing a first field oxide layer over the first, second, and third well of P-type conductivity;

growing a high-voltage oxide layer over the first field oxide layer;

overlaying a first photoresist mask which defines a plurality of tunneling windows;

etching the first field oxide layer and the high-voltage oxide layer;

stripping the first photoresist mask;

growing a tunnel oxide layer;

depositing a polysilicon layer;

doping the polysilicon layer;

overlaying a second photoresist mask which defines the plurality of floating gates;

etching the polysilicon layer;

stripping the second photoresist mask.

17. The method of claim 16 further comprising the step of embedding the EEPROM memory cell on core complementary metal oxide silicon for analog applications.

18. The method of claim 17, wherein only a single polysilicon layer is used in the fabrication of the EEPROM memory cell array.

* * * * *